US012593555B2

(12) United States Patent
Lee

(10) Patent No.: US 12,593,555 B2
(45) Date of Patent: Mar. 31, 2026

(54) CERAMIC SUBSTRATE WITH HEAT SINK AND MANUFACTURING METHOD THEREOF

(71) Applicant: AMOGREENTECH CO., LTD., Gimpo-si (KR)

(72) Inventor: Jihyung Lee, Cheonan-si (KR)

(73) Assignee: AMOGREENTECH CO., LTD., Gimpo-si (KR)

( * ) Notice: Subject to any disclaimer, the term of this patent is extended or adjusted under 35 U.S.C. 154(b) by 179 days.

(21) Appl. No.: 18/563,145

(22) PCT Filed: May 20, 2022

(86) PCT No.: PCT/KR2022/007226
§ 371 (c)(1),
(2) Date: Nov. 21, 2023

(87) PCT Pub. No.: WO2022/250382
PCT Pub. Date: Dec. 1, 2022

(65) Prior Publication Data
US 2024/0234670 A1 Jul. 11, 2024

(30) Foreign Application Priority Data

May 27, 2021 (KR) ........................ 10-2021-0068372

(51) Int. Cl.
*H10H 20/858* (2025.01)
*H01L 23/00* (2006.01)
(Continued)

(52) U.S. Cl.
CPC ....... *H10H 20/8586* (2025.01); *H01S 5/0206* (2013.01); *H01S 5/02469* (2013.01);
(Continued)

(58) Field of Classification Search
CPC ........... H10H 20/8586; H10H 20/8583; H10H 20/0365; H01S 5/0206; H01S 5/02469;
(Continued)

(56) References Cited

U.S. PATENT DOCUMENTS

| | | | | |
|---|---|---|---|---|
| 11,075,144 | B2 * | 7/2021 | Kato | ........................ H01L 25/07 |
| 11,310,935 | B2 * | 4/2022 | Jia | ............................ F28D 1/035 |

(Continued)

FOREIGN PATENT DOCUMENTS

| | | |
|---|---|---|
| JP | 2004-186527 A | 7/2004 |
| JP | 2005-340532 A | 12/2005 |

(Continued)

OTHER PUBLICATIONS

KR Office Action dated May 1, 2023 as received in Application No. 10-2022-0062044.

(Continued)

*Primary Examiner* — Claire E Rojohn, III
(74) *Attorney, Agent, or Firm* — Maschoff Brennan

(57) ABSTRACT

The present invention relates to a ceramic substrate with a heat sink and a manufacturing method thereof. The ceramic substrate comprises: a ceramic substrate including a metal layer on at least one surface of a ceramic base; and a heat sink that is bonded to one surface of the ceramic substrate and has a multi-layer structure that refrigerant enters and exits. The present invention has an integrated structure in which the heat sink having a multi-layer structure that refrigerant enters and exits is bonded to the ceramic substrate, and thus is capable of effectively dissipating heat generated from a semiconductor chip.

12 Claims, 13 Drawing Sheets

(51) Int. Cl.

| | | |
|---|---|---|
| *H01S 5/02* | (2006.01) | |
| *H01S 5/024* | (2006.01) | |
| *H10H 20/01* | (2025.01) | |

(52) U.S. Cl.

CPC ......... *H10H 20/8583* (2025.01); *H01L 24/29* (2013.01); *H01L 24/32* (2013.01); *H01L 2224/29139* (2013.01); *H01L 2224/32225* (2013.01); *H01L 2924/10253* (2013.01); *H01L 2924/10272* (2013.01); *H01L 2924/1033* (2013.01); *H01L 2924/12041* (2013.01); *H01L 2924/12042* (2013.01); *H10H 20/0365* (2025.01)

(58) Field of Classification Search

CPC .................... H01L 24/29; H01L 24/32; H01L 2224/29139; H01L 2224/32225; H01L 2924/10253; H01L 2924/10272; H01L 2924/1033; H01L 2924/12041; H01L 2924/12042

USPC .................... 165/53, 104.19, 104.33, 104.22

See application file for complete search history.

(56) References Cited

U.S. PATENT DOCUMENTS

| | | | | |
|---|---|---|---|---|
| 12,191,230 | B2 * | 1/2025 | Jensen .................. | H01L 23/473 |
| 2004/0206477 | A1 * | 10/2004 | Kenny .................... | F28D 15/00 |
| | | | | 257/E23.098 |
| 2008/0196875 | A1 * | 8/2008 | Kurtz ...................... | F28F 3/048 |
| | | | | 257/E23.098 |
| 2009/0008770 | A1 | 1/2009 | Hasegawa | |
| 2010/0170662 | A1 * | 7/2010 | Baba ....................... | H01L 23/24 |
| | | | | 165/104.19 |
| 2010/0296247 | A1 * | 11/2010 | Chang ................ | H05K 7/20927 |
| | | | | 361/699 |
| 2013/0010429 | A1 * | 1/2013 | Tonomura ............ | H01L 23/473 |
| | | | | 228/124.1 |
| 2015/0189791 | A1 * | 7/2015 | Tamura .................. | B23P 15/26 |
| | | | | 29/890.035 |
| 2017/0207145 | A1 * | 7/2017 | Yamada ............ | H01L 23/49838 |
| 2020/0258815 | A1 * | 8/2020 | Suzuki .................... | F28F 13/06 |
| 2020/0373222 | A1 * | 11/2020 | Iyengar .............. | H01L 23/3675 |
| 2021/0222967 | A1 * | 7/2021 | Vanderwees ........ | H01L 21/4882 |
| 2022/0299278 | A1 * | 9/2022 | Terao .................... | F28F 21/085 |
| 2024/0284785 | A1 * | 8/2024 | Lee .................... | H10K 85/6572 |
| 2024/0324443 | A1 * | 9/2024 | Ko ........................ | C07F 15/0086 |
| 2024/0347416 | A1 * | 10/2024 | Lee ........................ | H01L 23/15 |
| 2024/0404927 | A1 * | 12/2024 | Lee ........................ | H01L 23/373 |
| 2025/0081836 | A1 * | 3/2025 | Oh ........................ | C09K 11/06 |
| 2025/0098517 | A1 * | 3/2025 | Ju ........................ | H10K 85/346 |
| 2025/0120302 | A1 * | 4/2025 | Ko ........................ | H10K 85/653 |
| 2025/0167071 | A1 * | 5/2025 | Lee ........................ | H01L 23/36 |
| 2025/0191984 | A1 * | 6/2025 | Lee ........................ | H01L 24/05 |
| 2025/0203751 | A1 * | 6/2025 | Lee ...................... | H05K 1/0306 |
| 2025/0287509 | A1 * | 9/2025 | Lee .......................... | H05K 3/06 |

FOREIGN PATENT DOCUMENTS

| | | |
|---|---|---|
| JP | 2006-515054 A | 5/2006 |
| JP | 2008-042020 A | 2/2008 |
| JP | 2009-501439 A | 1/2009 |
| KR | 10-2009-0004738 A | 1/2009 |
| KR | 10-2010-0126087 A | 12/2010 |
| KR | 10-2012-0062751 A | 6/2012 |

OTHER PUBLICATIONS

KR Decision to Grant Dated Oct. 18, 2023 as received in Application No. 10-2022-0062044.

* cited by examiner

[FIG. 1]
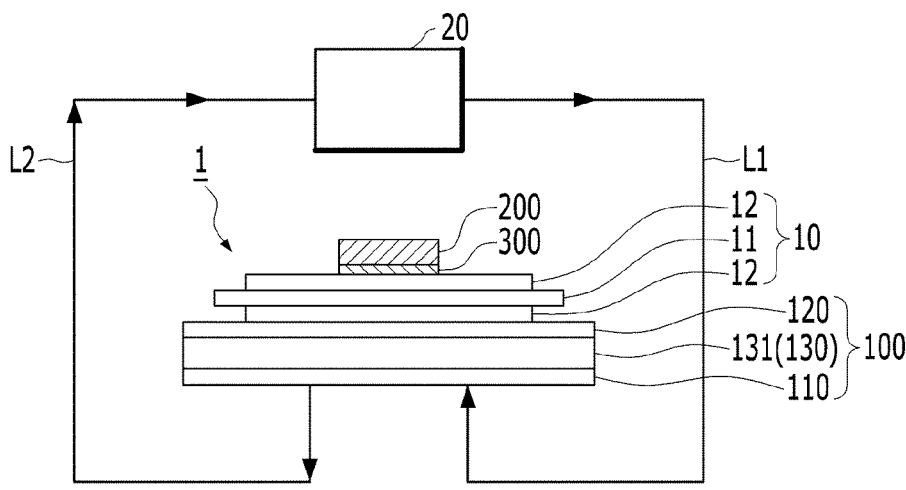
[FIG. 2]
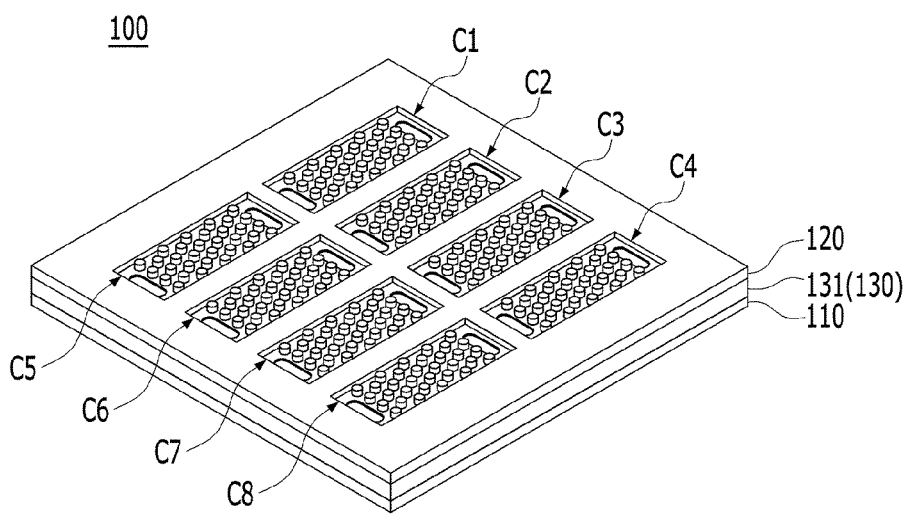

[FIG. 3]
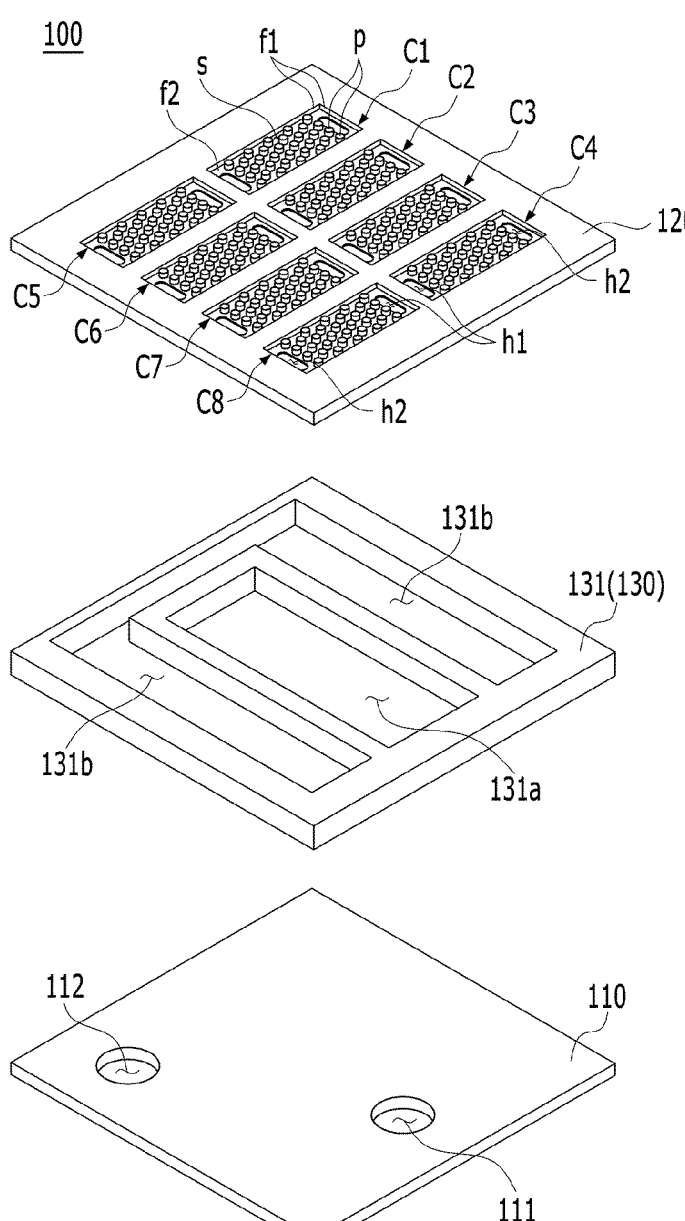

[FIG. 4]
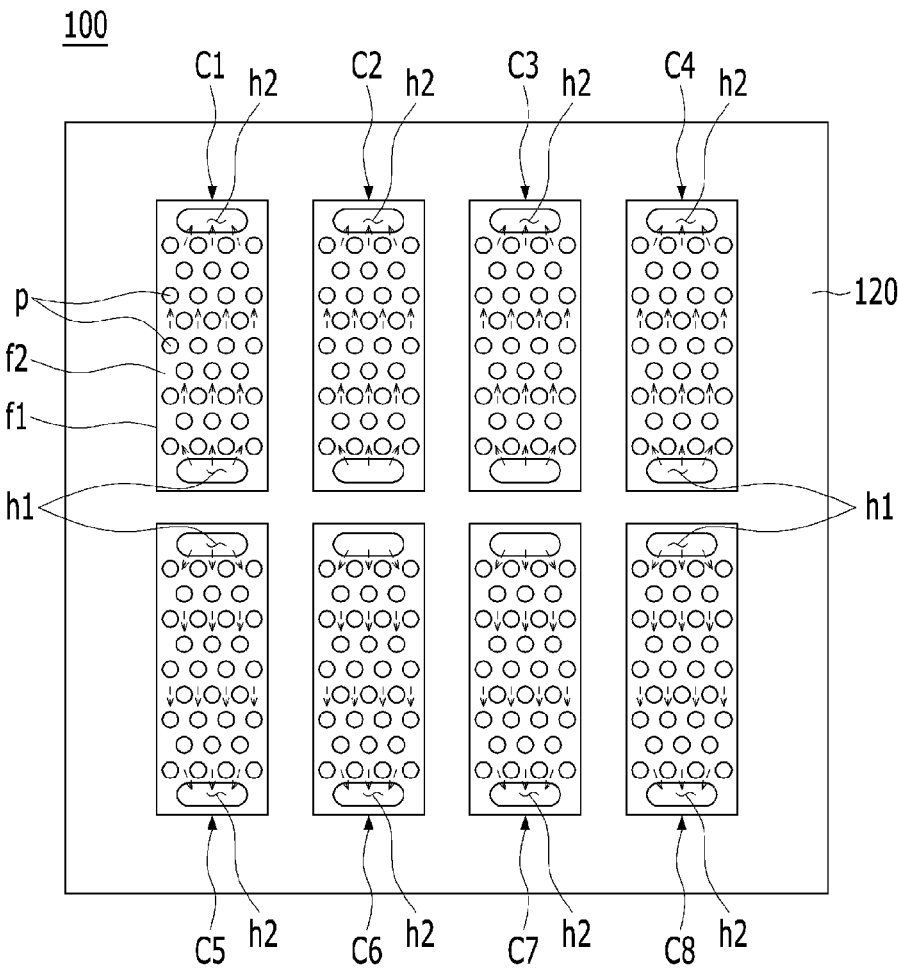

[FIG. 5]
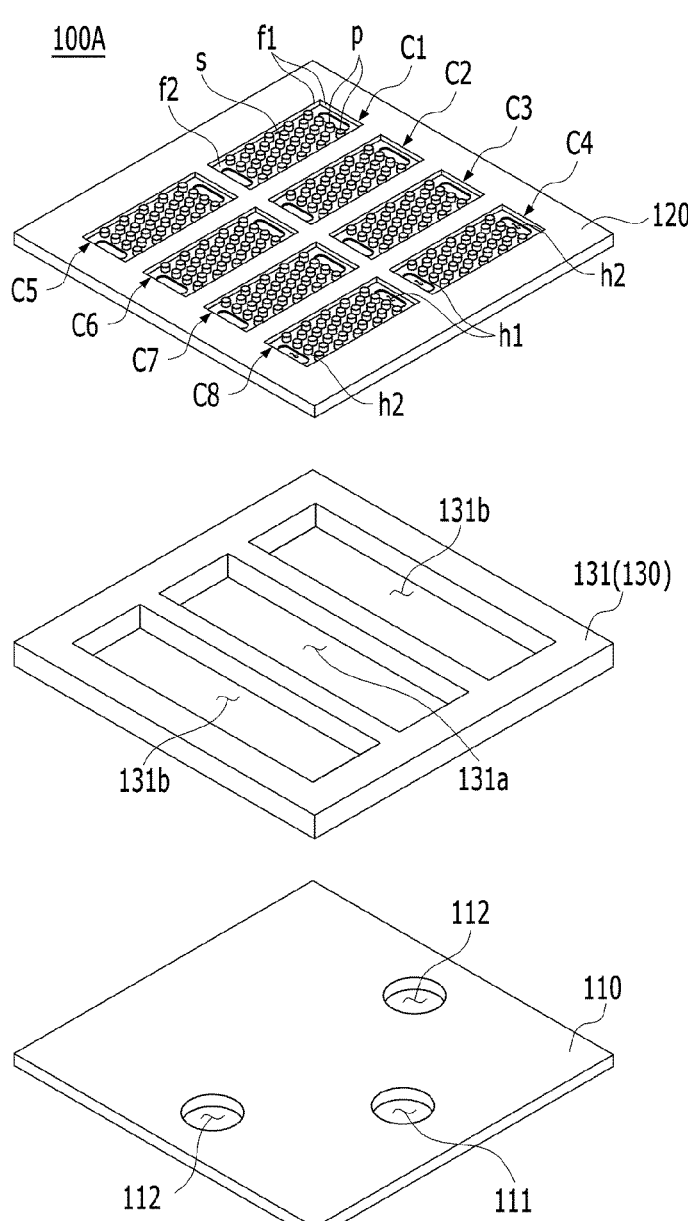

[FIG. 6]
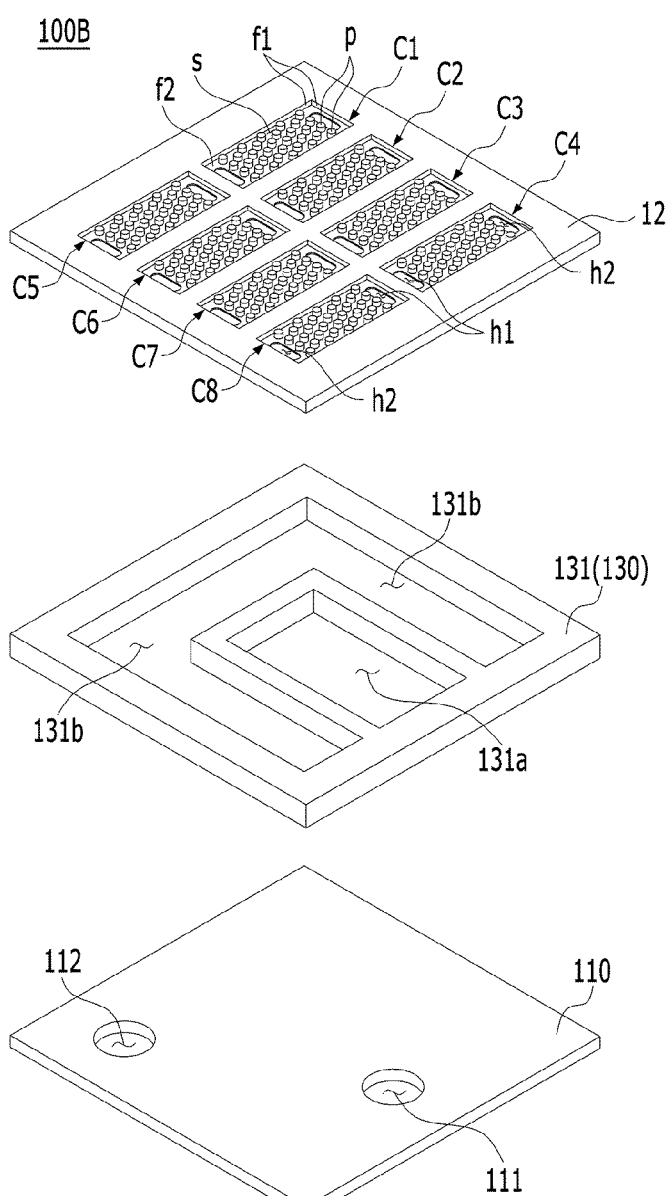

[FIG. 7]
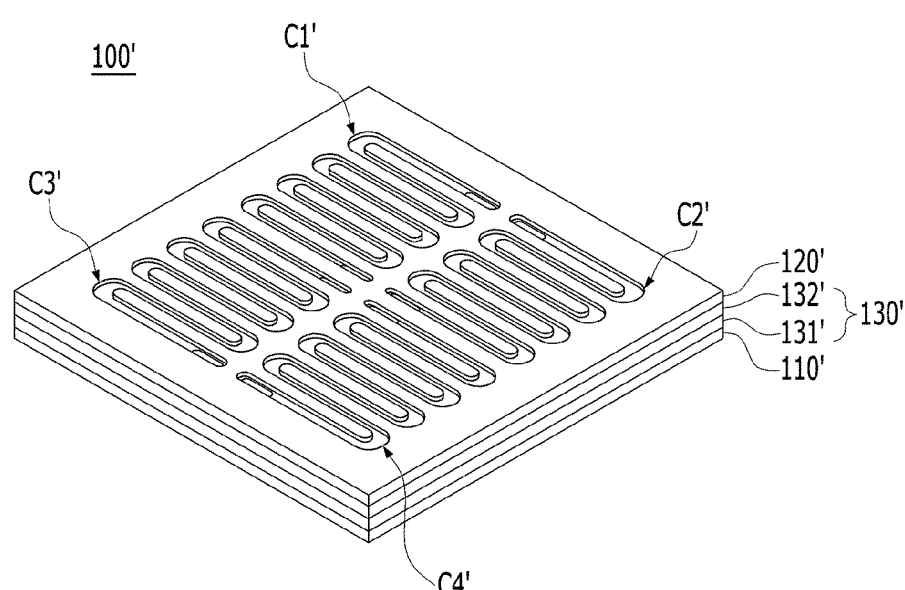

[FIG. 8]
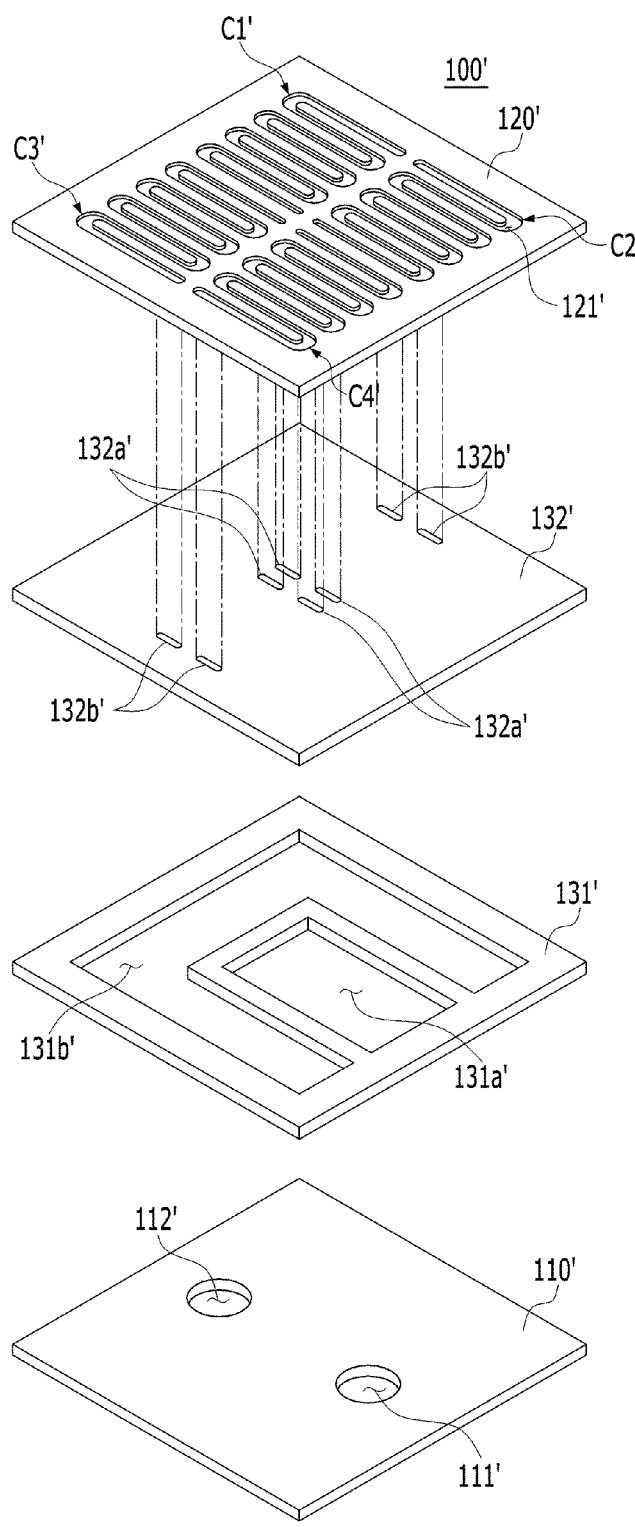

[FIG. 9]
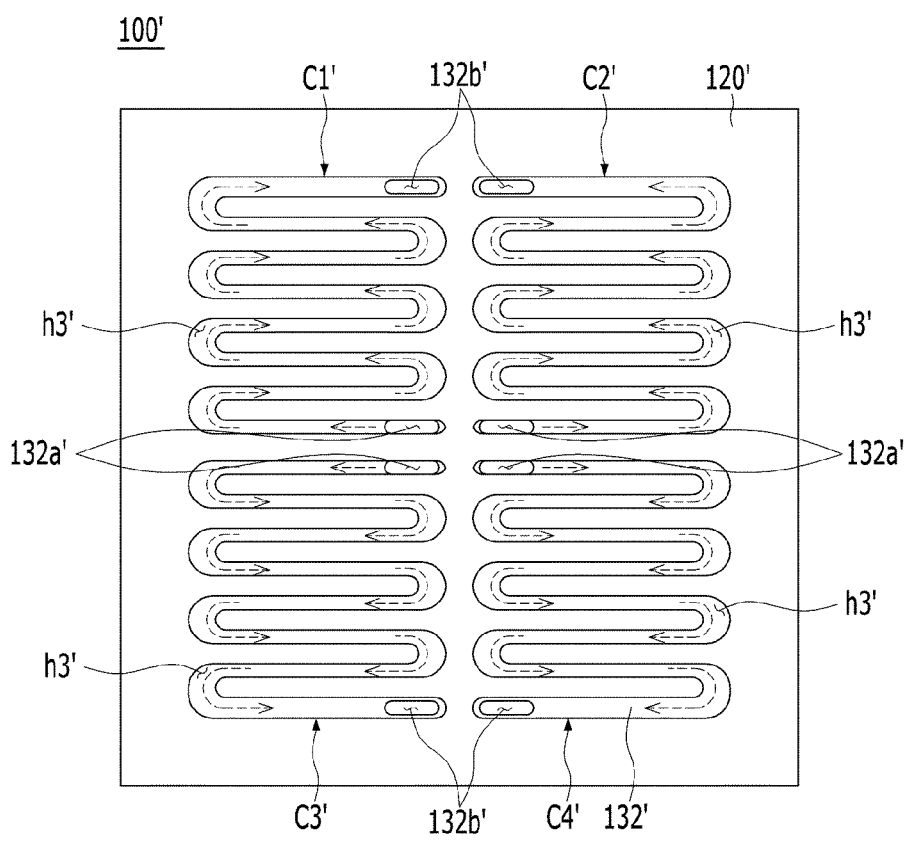

[FIG. 10]
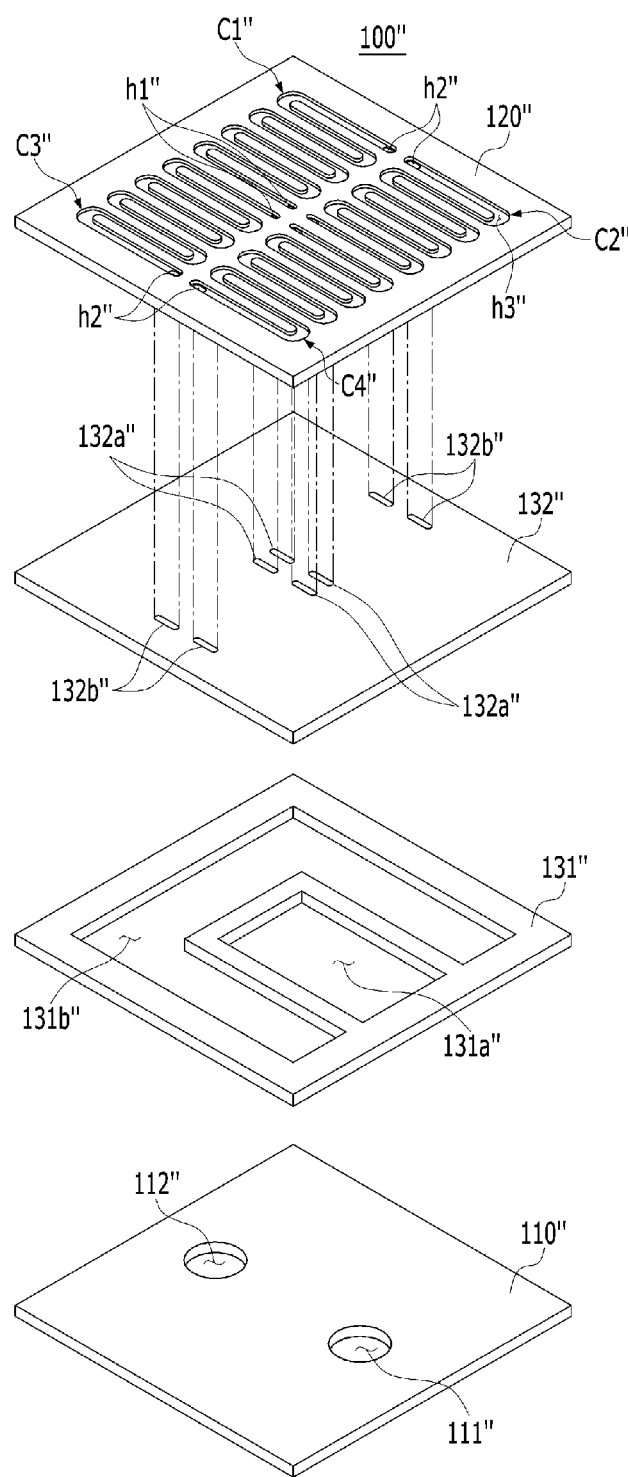

[FIG. 11]
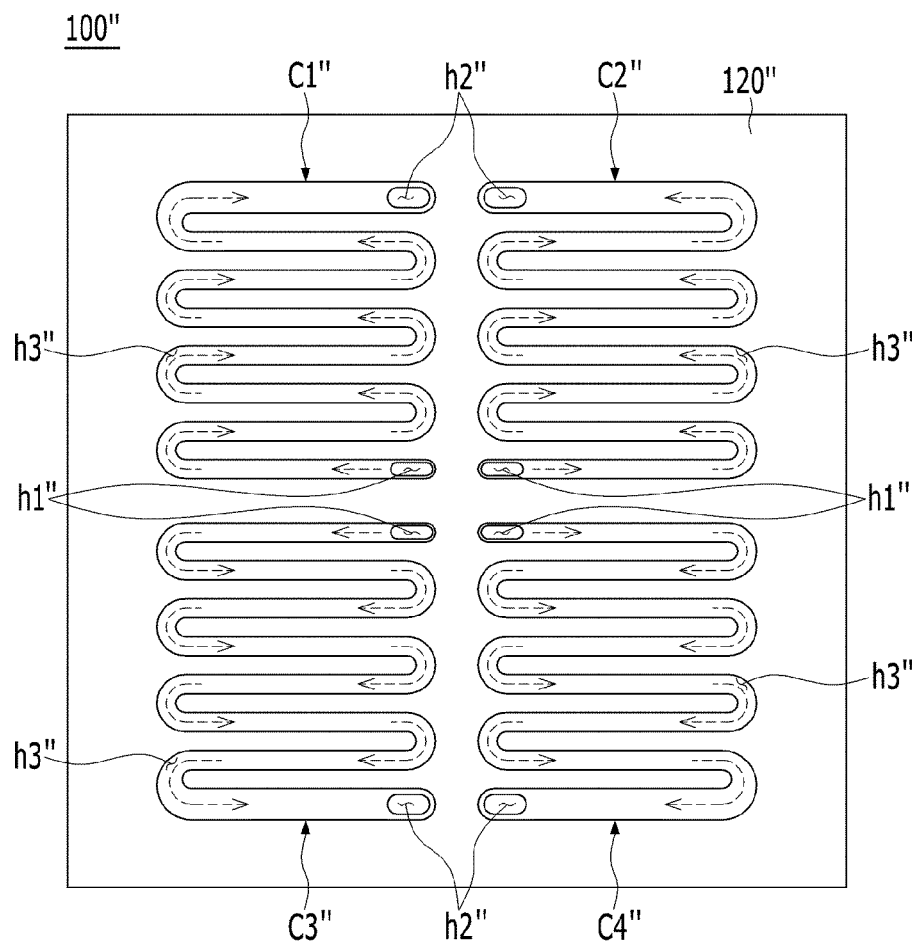

[FIG. 12]
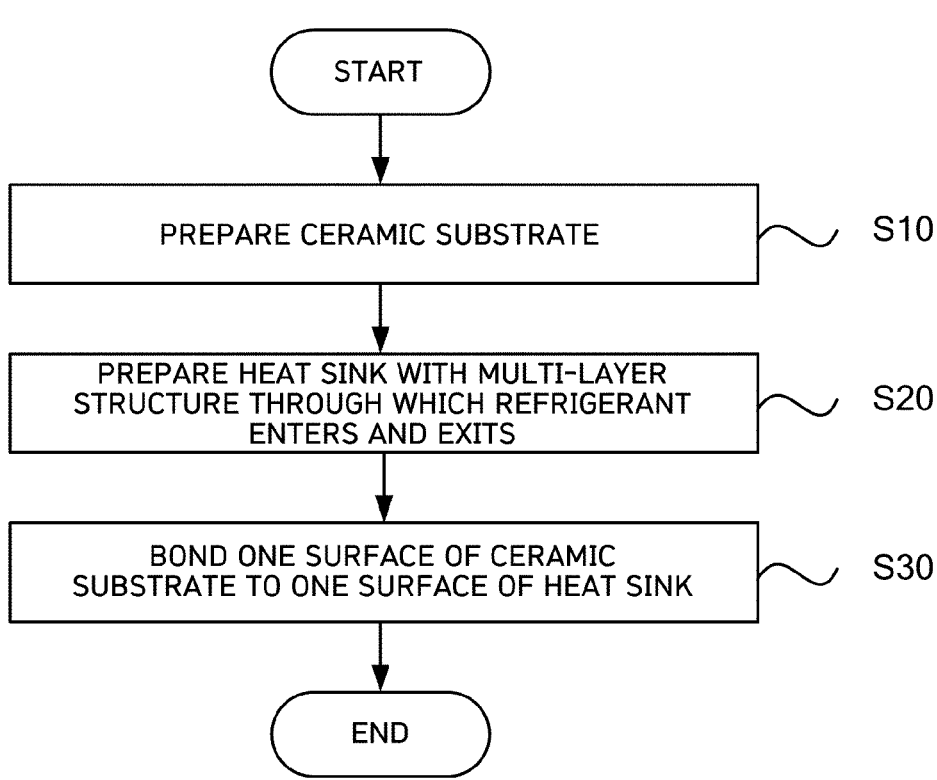

[FIG. 13]
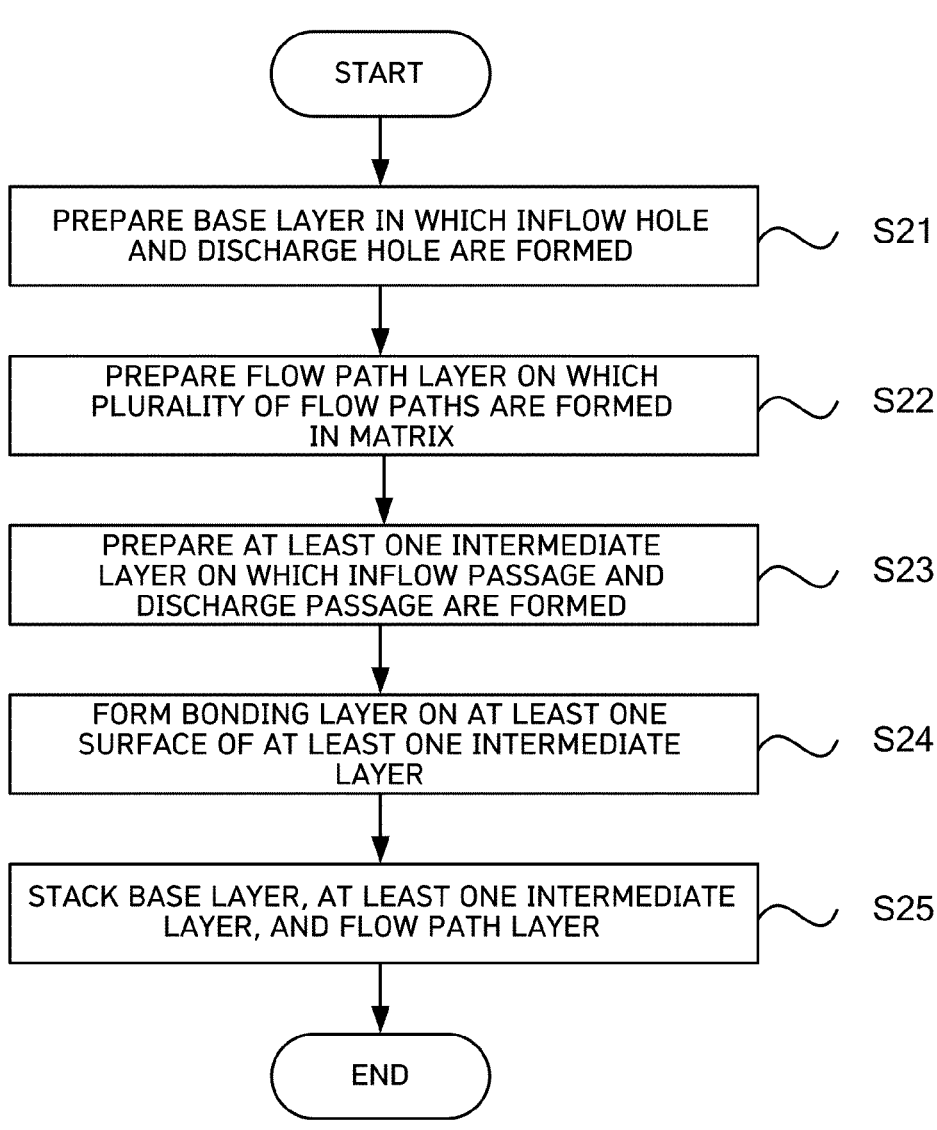

[FIG. 14]
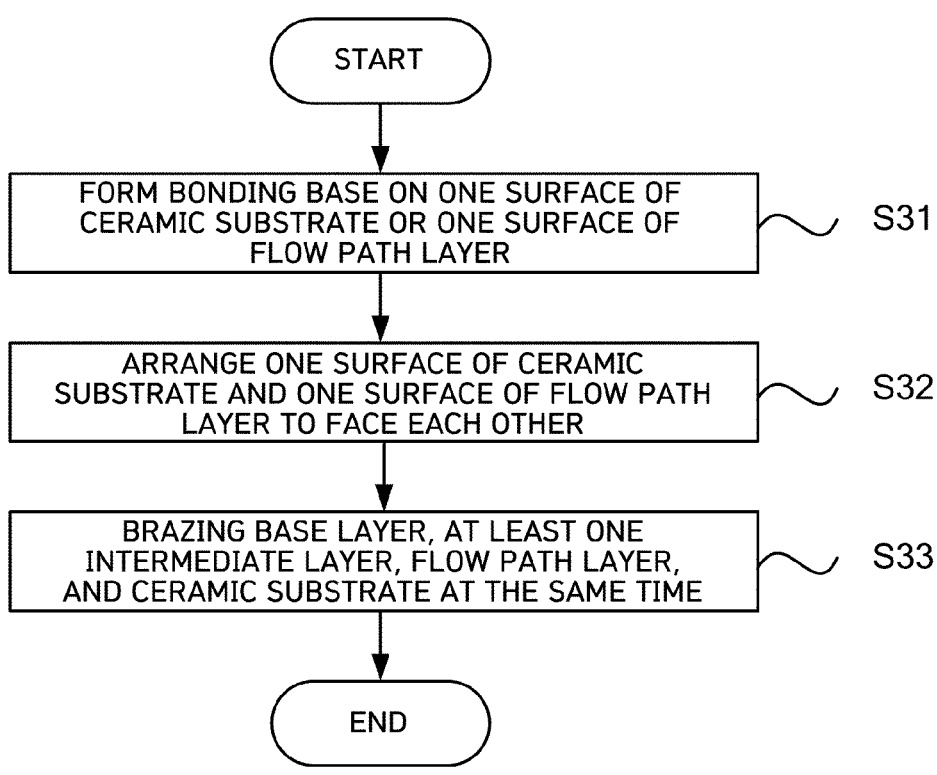

CERAMIC SUBSTRATE WITH HEAT SINK AND MANUFACTURING METHOD THEREOF

TECHNICAL FIELD

The present disclosure relates to a ceramic substrate with a heat sink and a manufacturing method thereof, and more specifically, to a ceramic substrate with a heat sink, which has a bonding structure of a heat sink with a multi-layer structure through which refrigerant enters and exits and the ceramic substrate, and a manufacturing method thereof.

BACKGROUND ART

A power module is a semiconductor module optimized for power conversion or control by modularizing semiconductor chips such as silicon carbide (SiC) and gallium nitride (GaN) into a package.

Depending on a usage environment, the power module generates hot heat due to a high-voltage and high-current operation of the semiconductor chip. In addition, since a lot of heat is also generated on a substrate on which the semiconductor chip is mounted, when a temperature of the substrate increases to a predetermined temperature or higher, the semiconductor chip deteriorates and does not work properly.

In order to solve this, a heat sink is provided on one surface of a ceramic or metal substrate to prevent a deterioration phenomenon of the semiconductor chip due to heat through a heat-dissipation function of the heat sink.

The heat sink is made of a metal material with a high thermal conductivity, such as copper and aluminum, and since the heat sink made of metal also has a limit in heat dissipation, when heat exceeding the limit or more is generated, cooling efficiency is degraded rapidly, causing a failure.

In addition, there is a problem in that the characteristics of the substrate on which the semiconductor chip is mounted are degraded due to the occurrence of bending or the like caused by heat.

SUMMARY OF INVENTION

Technical Problem

The present disclosure has been made in efforts to solve the problems and is directed to providing a ceramic substrate with a heat sink capable of effectively dissipating heat generated from a semiconductor chip, and a manufacturing method thereof.

Solution to Problem

In order to achieve the object, a ceramic substrate with a heat sink according to an embodiment of the present disclosure includes a ceramic substrate including a metal layer on at least one surface of a ceramic base, and the heat sink bonded to the one surface of the ceramic substrate and having a multi-layer structure through which refrigerant enters and exits. Here, the heat sink may have at least two adjacent layers made of different metal materials of the multi-layer structure.

The heat sink may include a base layer in which an inflow hole and a discharge hole are formed, a flow path layer which is disposed above the base layer and on which a plurality of flow paths are disposed in a matrix, and at least one intermediate layer disposed between the base layer and the flow path layer, formed with an inflow passage connecting one end of at least one of the plurality of flow paths to the inflow hole, and formed with a discharge passage connecting the other end of at least one of the plurality of flow paths to the discharge hole.

The base layer and the flow path layer may be made of the same metal material, and the at least one intermediate layer may be made of a different metal material from the base layer and the flow path layer. In this case, a coefficient of thermal expansion of the at least one intermediate layer may be lower than coefficients of thermal expansion of the base layer and the flow path layer. Specifically, a material of the at least one intermediate layer may be any one of CuMo and Mo, and materials of the base layer and the flow path layer may be any one of Cu, Al, stainless steel (STS), and a Cu alloy.

The overall thickness of the at least one intermediate layer may be greater than a thickness of each of the base layer and the flow path layer.

Refrigerant introduced through the inflow hole may be discharged through the discharge hole via the at least one intermediate layer and the flow path layer. In this case, the inflow hole and the discharge hole may be formed to be connected to an external refrigerant circulation driving unit, and the refrigerant may be continuously circulated by the refrigerant circulation driving unit.

Each of the plurality of flow paths may include a plurality of pins provided in a space surrounded by a side wall and a bottom surface and disposed at intervals, and an inlet hole and an outlet hole formed to pass through one end and the other end of the bottom surface with the plurality of pins interposed therebetween, and refrigerant flowing into the space through the inlet hole may be discharged through the outlet hole after passing between the plurality of pins.

The at least one intermediate layer may include a first intermediate layer including a first inflow passage extending long toward one end of at least one of the plurality of flow paths, and a first discharge passage extending long toward the other end of at least one of the plurality of flow paths, the first inflow passage may face the inflow hole, and the first discharge passage may face the discharge hole.

The at least one intermediate layer may further include a second intermediate layer disposed between the first intermediate layer and the flow path layer and including a second inflow passage formed to correspond to one end of at least one of the plurality of flow paths, and a second discharge passage formed to correspond to the other end of at least one of the plurality of flow paths. In this case, the second inflow passage may face the first inflow passage, and the second discharge passage may face the first discharge passage.

Each of the plurality of flow paths may be provided as a through hole in a zigzag shape with a repeated curved shape, a flow path groove may be formed of an inner surface of the through hole and an upper surface of the second intermediate layer, and refrigerant flowing into the flow path groove through the second inflow passage may be discharged through the second discharge passage after moving along the flow path groove.

Meanwhile, each of the plurality of flow paths may be provided as a flow path groove in a zigzag shape with a repeated curved shape, the flow path groove may include an inlet hole formed at one end thereof and an outlet hole formed at the other end thereof, and refrigerant flowing into the flow path groove through the inlet hole may be discharged through the outlet hole after moving along the flow path groove.

Meanwhile, the heat sink may further include a bonding layer bonding the base layer, the at least one intermediate layer, and the flow path layer, and the bonding layer may be made of a material including at least one of Ag and AgCu.

A method of manufacturing a ceramic substrate with a heat sink according to an embodiment of the present disclosure includes preparing a ceramic substrate including a metal layer on at least one surface of a ceramic base, preparing the heat sink with a multi-layer structure through which refrigerant enters and exits, and bonding one surface of the ceramic substrate to one surface of the heat sink.

The preparing of the heat sink may include preparing the heat sink with at least two adjacent layers made of different metal materials of the multi-layer structure.

The preparing of the heat sink may include preparing a base layer in which an inflow hole and a discharge hole are formed, preparing a flow path layer on which a plurality of flow paths are disposed in a matrix, preparing at least one intermediate layer formed with an inflow passage connecting one end of at least one of the plurality of flow paths to the inflow hole, and formed with a discharge passage connecting the other end of at least one of the plurality of flow paths to the discharge hole, forming a bonding layer on at least one surface of the at least one intermediate layer, and stacking the base layer, the at least one intermediate layer, and the flow path layer.

The preparing of the heat sink may include brazing the base layer, the at least one intermediate layer, and the flow path layer by melting the bonding layer.

The bonding of the one surface of the ceramic substrate to the one surface of the heat sink may include forming a bonding base on the one surface of the ceramic substrate or the one surface of the flow path layer, arranging the one surface of the ceramic substrate and the one surface of the flow path layer to face each other, and brazing the base layer, the at least one intermediate layer, the flow path layer, and the ceramic substrate at the same time by melting the bonding base and the bonding layer.

Advantageous Effects of Invention

According to the present disclosure, by forming the heat sink in which the intermediate layer made of the material with the low coefficient of thermal expansion is formed between the base layer and the flow path layer, which are made of the material with the high thermal conductivity, it is possible to prevent the bending phenomenon at the high temperature due to the decrease in the coefficient of thermal expansion of the heat sink and maximize the heat-dissipation effect with the excellent thermal conductivity.

In addition, according to the present disclosure, by integrally bonding the heat sink with the multi-layer structure through which refrigerant enters and exits to the ceramic substrate to circulate the refrigerant through the heat sink, it is possible to prevent the overheating of the ceramic substrate.

In addition, according to the present disclosure, by forcibly cooling the heat generated from the semiconductor chip and the like through the refrigerant, it is possible to maximize the heat-dissipation effect and maintain the semiconductor chip at the constant temperature to prevent deterioration.

In addition, according to the present disclosure, since the refrigerant circulates while passing through several layers of the heat sink, it is possible to quickly absorb and dissipate the heat.

In addition, according to the present disclosure, since the flow path groove through which the refrigerant passes is formed in a zigzag shape with a repeated curved shape, the path along which the refrigerant moves extends to make it easy to expand the heat-dissipation area.

In addition, according to the present disclosure, by forming the flow path so that the refrigerant moves between the plurality of pins, it is possible to easily adjust the movement of the refrigerant as the number and the arrangement of plurality of pins are changed.

BRIEF DESCRIPTION OF DRAWINGS

FIG. 1 is a conceptual diagram illustrating a configuration in which an external refrigerant circulation driving unit is connected to a ceramic substrate with a heat sink according to one embodiment of the present disclosure.

FIG. 2 is a perspective view illustrating the ceramic substrate with the heat sink according to one embodiment of the present disclosure.

FIG. 3 is an exploded perspective view illustrating the ceramic substrate with the heat sink according to one embodiment of the present disclosure.

FIG. 4 is a plan view illustrating the ceramic substrate with the heat sink according to one embodiment of the present disclosure.

FIG. 5 is an exploded perspective view illustrating a heat sink according to a first modified example in which an intermediate layer and a base layer are different from those in the embodiment of FIG. 3.

FIG. 6 is an exploded perspective view illustrating a heat sink according to a second modified example in which an intermediate layer is different from that of the embodiment of FIG. 3.

FIG. 7 is a perspective view illustrating a ceramic substrate with a heat sink according to another embodiment of the present disclosure.

FIG. 8 is an exploded perspective view illustrating the ceramic substrate with the heat sink according to another embodiment of the present disclosure.

FIG. 9 is a plan view illustrating the ceramic substrate with the heat sink according to another embodiment of the present disclosure.

FIG. 10 is an exploded perspective view illustrating a heat sink according to a modified example in which a flow path layer is different from that of the embodiment of FIG. 8.

FIG. 11 is a plan view illustrating the heat sink of FIG. 10.

FIG. 12 is a flowchart illustrating a method of manufacturing the ceramic substrate with the heat sink according to one embodiment of the present disclosure.

FIG. 13 is a flowchart illustrating preparing the heat sink in the method of manufacturing the ceramic substrate with the heat sink according to one embodiment of the present disclosure.

FIG. 14 is a flowchart illustrating bonding one surface of the ceramic substrate to one surface of the heat sink in the method of manufacturing the ceramic substrate with the heat sink according to one embodiment of the present disclosure.

DESCRIPTION OF EMBODIMENTS

Hereinafter, embodiments of the present disclosure will be described in detail with reference to the accompanying drawings.

FIG. 1 is a conceptual diagram illustrating a configuration in which an external refrigerant circulation driving unit is connected to a ceramic substrate with a heat sink according to one embodiment of the present disclosure.

As illustrated in FIG. 1, a ceramic substrate with a heat sink 1 according to an embodiment of the present disclosure may be provided in an integrated form including a ceramic substrate 10 and a heat sink 100.

A semiconductor chip 200 may be mounted on an upper surface of the ceramic substrate 10. The semiconductor chip 200 may be a semiconductor chip such as SiC, GaN, Si, an LED, or a VCSEL. The semiconductor chip 200 may be bonded to an upper surface of the ceramic substrate 10 in the form of a flip chip by a bonding layer 300 containing solder or Ag paste. As described above, when the semiconductor chip 200 is bonded in the form of the flip chip, wire bonding is omitted, and thus it is possible to decrease an inductance value as much as possible and improve heat-dissipation performance.

The ceramic substrate 10 may be any one of an active metal brazing (AMB) substrate, a direct bonded copper (DBC) substrate, and a thick printing copper (TPC) substrate. Here, the ceramic substrate 10 may be provided as a ceramic substrate including a ceramic base 11 and a metal layer 12 formed on at least one surface of the ceramic base 11 so as to increase the heat-dissipation efficiency of heat generated from the semiconductor chip.

The ceramic base 11 may be made of, for example, any one of alumina ($Al_2O_3$), AlN, SiN, and $Si_3N_4$, and the metal layer 12 may be made of, for example, one of Cu, a Cu alloy, OFC, EPT Cu, and Al. OFC is anoxic copper. The metal layer 12 may be formed of an electrode pattern on which a semiconductor chip is mounted and an electrode pattern on which a driving device is mounted by brazing a metal foil on the ceramic base 11. For example, the metal layer 12 may be formed of an electrode pattern in an area in which the semiconductor chip or nearby components are mounted. The metal foil is, for example, an aluminum foil or a copper foil. For example, the metal foil is fired on the ceramic base 11 at 780 to 1100° C. and brazed to the ceramic base 11. The substrate is called the AMB substrate. In an embodiment, the AMB substrate will be described as an example, but the DBC substrate, the TPC substrate, or a direct brazed aluminum (DBA) substrate may be applied. Here, the AMB substrate is most suitable in terms of durability and heat-dissipation efficiency.

The heat sink 100 may be bonded to one surface of the ceramic substrate 10 and may have a multi-layer structure through which refrigerant enters and exits. The multi-layer structure of the heat sink 100 may be designed to have 2 to 12 layers, and in the embodiment, the heat sink 100 with a structure in which at least one intermediate layer 130 and a flow path layer 120 are stacked on a base layer 110 will be described.

An inflow hole 111 and a discharge hole 112 (see FIG. 3) may be formed in the base layer 110 of the heat sink 100, and refrigerant introduced through the inflow hole 111 may be discharged through the discharge hole 112 via the at least one intermediate layer 130 and the flow path layer 120 on the base layer 110.

The inflow hole 111 of the heat sink 100 may be connected to an external refrigerant circulation driving unit 20 through a first circulation line L1, and the discharge hole 112 of the heat sink 100 may be connected to the refrigerant circulation driving unit 20 through a second circulation line L2. In this case, the refrigerant circulation driving unit 20 may circulate the refrigerant using a driving force of a pump (not illustrated). In other words, the refrigerant circulation driving unit 20 may continuously circulate the refrigerant along a refrigerant circulation path including the first circulation line L1, the heat sink 100, and the second circulation line L2. Here, the refrigerant may be deionized water, but is not limited thereto, and liquid nitrogen, alcohol, or other solvents may be used, as necessary.

The refrigerant supplied from the refrigerant circulation driving unit 20 may flow into the inflow hole 111 through the first circulation line L1 and move toward the discharge hole 112 after passing through the at least one intermediate layer 130 and the flow path layer 120 on the base layer 110, and then the refrigerant may be discharged from the discharge hole 112 to move back to the refrigerant circulation driving unit 20 through the second circulation line L2. Although not illustrated in detail, the refrigerant circulation driving unit 20 may include a heat exchanger (not illustrated). The heat exchanger of the refrigerant circulation driving unit 20 may decrease a temperature of the refrigerant of which temperature has increased while passing through the heat sink 100, and the refrigerant circulation driving unit 20 may supply the refrigerant of which the temperature is decreased by the heat exchanger back to the first circulation line L1 using the driving force of the pump.

Since the heat sink 100 is in a state of being in contact with a lower portion of the ceramic substrate 10, the refrigerant may easily exchange heat with the ceramic substrate 10 while circulating along the inflow hole 111, the at least one intermediate layer 130, the flow path layer 120, and the discharge hole 112 of the heat sink 100. In other words, the heat sink 100 can prevent the ceramic substrate 10 from being overheated by the semiconductor chip 200. In addition, the heat sink 100 may forcibly cool the heat generated from the semiconductor chip 200 and the like through the refrigerant to maximize the heat-dissipation effect and maintain the semiconductor chip 200 at a constant temperature to prevent deterioration.

FIG. 2 is a perspective view illustrating the ceramic substrate with the heat sink according to one embodiment of the present disclosure. In FIG. 2, the ceramic substrate 10 is not illustrated for convenience and likewise, will be omitted below.

The ceramic substrate with the heat sink 1 according to the embodiment of the present disclosure may be provided to implement the heat-dissipation characteristics required as the semiconductor chip from which heat is generated is provided, and as illustrated in FIG. 2, the heat sink 100 may be provided by stacking the at least one intermediate layer 130 and the flow path layer 120 on the base layer 110 to increase the cooling effect. In this case, a groove, a hole, or the like for increasing the circulation and cooling effects of the refrigerant may be variously designed in each layer of the heat sink 100, and a shape of the groove, the hole, or the like may be implemented by etching processing, molding processing, and other processing. In addition, the heat sink 100 may be made of a material with an excellent thermal conductivity to increase the heat-dissipation effect. For example, the heat sink 100 may be made of at least one of Cu, Al, and a Cu alloy. In addition, the heat sink 100 may be made of a non-metallic material with a high thermal conductivity. As will be described below, the heat sink 100 may be formed in a structure in which the base layer 110 and the flow path layer 120, which are made of a Cu material that has a relatively higher coefficient of thermal expansion but has a high thermal conductivity are stacked on upper and lower portions of the intermediate layer 130 made of a CuMo or Mo material with a relatively lower coefficient of thermal expansion, and thus it is possible to prevent a bending phenomenon at a high temperature.

In the heat sink 100, a plurality of flow paths C1, C2, C3, C4, C5, C6, C7, and C8, which are micro channels, may be formed therein, and a method of cooling the refrigerant by allowing the refrigerant to flow through these flow paths C1 to C8 may be applied thereto. In other words, the method of forcibly circulating and cooling the refrigerant is applied to the heat sink 100, and the refrigerant may quickly absorb and dissipate heat while passing through several layers of the heat sink 100.

FIG. 3 is an exploded perspective view illustrating the ceramic substrate with the heat sink according to one embodiment of the present disclosure, and FIG. 4 is a plan view illustrating the ceramic substrate with the heat sink according to one embodiment of the present disclosure.

As illustrated in FIG. 3, the heat sink 100 may include the base layer 110, the flow path layer 120, and the at least one intermediate layer 130.

The base layer 110 may have the inflow hole 111 and the discharge hole 112 formed to pass therethrough. The inflow hole 111 may be connected to the refrigerant circulation driving unit 20 through the first circulation line L1 (see FIG. 1), and the discharge hole 112 may be connected to the refrigerant circulation driving unit 20 through the second circulation line L2 (see FIG. 1). Therefore, although not illustrated, an end of the first circulation line L1 may be connected to the inflow hole 111, and an end of the second circulation line L2 may be connected to the discharge hole 112. Here, the first and second circulation lines L1 and L2 may be provided as hoses or the like, and the ends of the first and second circulation lines L1 and L2 may be connected to the inflow hole 111 and the discharge hole 112 by various fasteners (not illustrated) such as a bolt. In addition, the inflow hole 111 and the discharge hole 112 may be formed as a plurality of inflow holes and discharge holes, as necessary, and the end of each of the first and second circulation lines L1 and L2 may be branched and provided to be connected to the plurality of inflow holes 111 and discharge holes 112.

The flow path layer 120 may be disposed above the base layer 110 and may have an upper surface on which the plurality of flow paths C1, C2, C3, C4, C5, C6, C7, and C8 are disposed in a matrix. In the embodiment, although an example in which the first to eighth flow paths C1 to C8 are provided is illustrated, the present disclosure is not limited thereto, and the number of flow paths may be variously changed depending on a desired cooling temperature, water pressure, or the like.

A plurality of pins p may be provided on each of the plurality of flow paths C1 to C8 of the flow path layer 120. The plurality of pins p may be provided in a space s surrounded by a side wall f1 and a bottom surface f2. The plurality of pins p may be disposed at intervals and formed to protrude in a vertical direction. The plurality of pins p may be formed in a cylindrical shape. Since side surfaces of the plurality of pins p are portions in which the refrigerant touches while moving, when the side surfaces of the plurality of pins p are formed as curved surfaces, the refrigerant may move smoothly between the plurality of pins p without obstruction.

An inlet hole h1 and an outlet hole h2 provided in each of the plurality of flow paths C1 to C8 may be formed to pass through one end and the other end of the bottom surface f2 with the plurality of pins p interposed therebetween.

The at least one intermediate layer 130 may be disposed between the base layer 110 and the flow path layer 120. An inflow passage connecting one end of at least one of the plurality of flow paths C1 to C8 to the inflow hole 111 may be formed on the intermediate layer 130. In addition, a discharge passage connecting the other end of at least one of the plurality of flow paths C1 to C8 to the discharge hole 112 may be formed on the intermediate layer 130.

Specifically, the at least one intermediate layer 130 may include a first intermediate layer 131.

The first intermediate layer 131 may include a first inflow passage 131a extending long toward the one end of the at least one of the plurality of flow paths C1 to C8, and a first discharge passage 131b extending long toward the other end of the at least one of the plurality of flow paths C1 to C8. Specifically, the first inflow passage 131a of the first intermediate layer 131 may extend long toward the inlet holes h1 provided in the plurality of flow paths C1 to C8, and the first discharge passage 131b of the first intermediate layer 131 may extend long toward the outlet holes h2 provided in the plurality of flow paths C1 to C8. In addition, the first inflow passage 131a may face the inflow hole 111, and the first discharge passage 131b may face the discharge hole 112.

As described above, as the first inflow passage 131a and the first discharge passage 131b are formed to extend long, even when a distance between the inflow hole 111 and the inlet hole h1 and a distance between the outlet hole h2 and the discharge hole 112 are long, the refrigerant may move smoothly.

Describing the refrigerant circulation path in the heat sink 100 with reference to FIGS. 3 and 4, the refrigerant introduced through the inflow hole 111 of the base layer 110 may move to the inlet hole h1 of at least one of the plurality of flow paths C1 to C8 after passing through the first inflow passage 131a and flow into the space s surrounded by the side wall f1 and the bottom surface f2 through the inlet hole h1, and the refrigerant flowing into the space s may be discharged through the outlet hole h2 after passing between the plurality of pins p. Then, the refrigerant may be discharged through the discharge hole 112 of the base layer 110 after passing through the first discharge passage 131b connected to the outlet hole h2. As described above, since the refrigerant moves between the plurality of pins p, the movement of the refrigerant may be easily adjusted by changing the number and arrangement of plurality of pins p. Since a temperature of the refrigerant circulating in the heat sink 100 is about 25° C. and the semiconductor chip 200 generates hot heat of about 100° C. or higher, the refrigerant may quickly cool the heat while continuously circulating along the circulation path of the heat sink 100.

As described above, the heat sink 100 may have a multi-layer structure through which refrigerant enters and exits, and in this case, at least two adjacent layers of the multi-layer structure may be made of different metal materials.

In other words, the heat sink 100 may have a multi-layer structure including the base layer 110, the flow path layer 120, and the at least one intermediate layer 130, and at least two adjacent layers of the multi-layer structure may be made of different metal materials.

Specifically, the base layer 110 and the flow path layer 120 may be made of the same metal material, and the at least one intermediate layer 130 may be made of a different metal material from the base layer 110 and the flow path layer 120.

As an example, a material of the at least one intermediate layer 130 may be any one of CuMo and Mo, and materials of the base layer 110 and the flow path layer 120 may be any one of Cu, Al, stainless steel (STS), and a Cu alloy.

Here, when the base layer 110 is formed of a metal layer made of a Cu material, the at least one intermediate layer 130 is formed of a metal layer made of a CuMo material, and when the flow path layer 120 is a CPC material formed of a metal layer made of the Cu material, CuMo is for preventing the occurrence of bending with a low coefficient of thermal expansion, and Cu is for securing a thermal conductivity for heat dissipation.

CuMo has a relatively lower coefficient of thermal expansion than Cu. Cu has a coefficient of thermal expansion of 17 ppm/° C. and a thermal conductivity of 393 W/m·° C., and CuMo has a coefficient of thermal expansion of 7.0 ppm/° C. and a thermal conductivity of 160 W/m·° C.

As described above, when there is provided the heat sink 100 with a three-layer structure in which the base layer 110 and the flow path layer 120, which are made of the Cu material, that have a relatively higher coefficient of thermal expansion but have a higher thermal conductivity are bonded to upper and lower portions of the at least one intermediate layer 130 made of the CuMo material with a relatively lower coefficient of thermal expansion, by decreasing the coefficient of thermal expansion, it is possible to prevent the bending phenomenon at the high temperature.

When the heat sink 100 is made of only the Cu material, the coefficient of thermal expansion of Cu is 17 ppm/° C., and thus when hot heat is generated in the semiconductor chip 200 mounted on the ceramic substrate 10, thermal deformation occurs and thus heat-dissipation performance may be degraded. The heat sink 100 is formed in the multi-layer structure to achieve weight reduction and miniaturization and increase heat-dissipation performance, and the heat sink 100 with the multi-layer structure may be further deformed when hot heat is generated by a large number of pores present therein. In other words, since the deformation of at least one layer of the multi-layer, such as bending or warpage, occurs, the refrigerant is not circulated, and thus heat-dissipation performance may be greatly degraded.

The heat sink 100 with the three-layer structure of Cu/CuMo/Cu has the thermal characteristics such as a coefficient of thermal expansion in a range of 6.8 to 7.8 ppm/° C. and a thermal conductivity of 240 W/m·° C. As described above, the heat sink 100 with the three-layer structure of Cu/CuMo/Cu may have a low coefficient of thermal expansion to prevent the bending at the high temperature and have an excellent thermal conductivity to satisfy high heat-dissipation conditions required by a power module.

In addition, the heat sink 100 with the three-layer structure of Cu/CuMo/Cu may be firmly bonded to the ceramic substrate 10. Since the heat sink 100 is bonded to one surface of the ceramic substrate 10, when a difference in the coefficients of thermal expansion of the heat sink 100 and the ceramic substrate 10 is large, thermal stress may occur between the heat sink 100 and the ceramic substrate 10. When the thermal stress occurs, a bonded portion between the heat sink 100 and the ceramic substrate 10 may be damaged. Therefore, in the present invention, by forming the at least one intermediate layer 130 made of the CuMo material with a relatively lower coefficient of thermal expansion between the base layer 110 and the flow path layer 120, which are made of the Cu material, the coefficient of thermal expansion of the heat sink 100 may be controlled to be similar to the coefficient of thermal expansion of the ceramic substrate 10. Therefore, it is possible to mitigate the thermal stress caused by the difference in the coefficients of thermal expansion of the heat sink 100 and the ceramic substrate 10, thereby increasing a bonding strength.

A thickness of the at least one intermediate layer 130 made of the CuMo material may be 0.6 T, and thicknesses of the base layer 110 and the flow path layer 120, which are made of the Cu material, may be 0.3 T. In this case, the thickness of the heat sink 100 with the three-layer structure of Cu/CuMo/Cu, may be 1.2 T (mm). As described above, the overall thickness of the at least one intermediate layer 130 may be formed greater than the thicknesses of the base layer 110 and the flow path layer 120. Since the at least one intermediate layer 130 is made of a material with a low coefficient of thermal expansion, such as CuMo, when the at least one intermediate layer 130 is greater than the thicknesses of the base layer 110 and the flow path layer 120, which are made of the Cu material, there is an advantage in that it is possible to more strongly suppress bending.

In addition, since the heat sink 100 may be formed in the three-layer structure or the multi-layer bonding structure by bonding the metal layers made of the Cu material on an upper surface and a lower surface of the metal layer made of the CuMo material, there is no threshold of the thickness, and thus there is an advantage in that it is possible to manufacture the heat sink 100 in a desired thickness and maximize the heat-dissipation effect. For example, the overall thickness of the heat sink 100 may be in a range of 1.0 to 15.0 mm. Preferably, since the thickness of the heat sink 100 is 2.0 mm or more, it is advantageous for heat dissipation and it is possible to minimize the occurrence of bending.

Meanwhile, although not illustrated, the base layer 110, the at least one intermediate layer 130, and the flow path layer 120 may be bonded by a bonding layer (not illustrated). In this case, the bonding layer may be made of a material containing at least one of Ag and AgCu. Ag and AgCu may function to increase the bonding strength due to the high thermal conductivity and at the same time, facilitate heat transfer to increase the heat-dissipation efficiency. The bonding layer may be formed by any one method of plating, paste application, and foil attachment and may have a thickness of about 0.3 to 3.0 μm.

The bonding layer may be disposed between an upper surface of the base layer 110 and a lower surface of the at least one intermediate layer 130 and between an upper surface of the at least one intermediate layer 130 and a lower surface of the flow path layer 120 and may integrally bond the base layer 110, the at least one intermediate layer 130, and the flow path layer 120 at a brazing temperature. The brazing temperature may be in a range of 800 to 950° C. The brazing is to bond base materials by permeating and diffusing the bonding layer between the base materials to be bonded after melting only the bonding layer at temperatures of melting points or less of the base materials using a wetting phenomenon, a capillary phenomenon, and the like and has an excellent bonding strength, and thus has excellent bonding reliability compared to general welding bonding or the like.

Meanwhile, the base layer 110, the intermediate layer 130, and the flow path layer 120 may be bonded by diffusion bonding. The diffusion bonding uses the diffusion of atoms generated from a bonded surface by applying heat and a pressure and has the characteristics in which the bonding is performed in a solid state and there is little thermal stress or deformation after bonding.

As described above, the base layer 110, the at least one intermediate layer 130, and the flow path layer 120 may be airtightly bonded through the brazing or the diffusion bonding and bonded to have a high bonding strength to withstand a water pressure, a hydraulic pressure, and the like.

FIG. 5 is an exploded perspective view illustrating a heat sink according to a first modified example in which an intermediate layer and a base layer are different from those of the embodiment of FIG. 3.

As illustrated in FIG. 5, in a heat sink 100A according to a first modified example, the first inflow passage 131*a* formed in the first intermediate layer 131 may be formed to extend long toward the inlet holes h1 of the first to eighth flow paths C1 to C8, and the first discharge passage 131*b* disposed at both sides of the first inflow passage 131*a* may be formed to extend long toward the outlet holes h2 of the first to eighth flow paths C1 to C8. As described above, when the first inflow passage 131*a* and the first discharge passage 131*b* formed parallel to each other are formed, the refrigerant may flow into the spaces s of the first to eighth flow paths C1 to C8 through the inlet holes h1 of the first to eighth flow paths C1 to C8 and may be discharged through the outlet holes h2 after passing between the plurality of pins p in the space s.

In the first modified example of FIG. 5, the base layer 110 may include the inflow hole 111 facing the first inflow passage 131*a* and a pair of discharge holes 112 facing the first discharge passage 131*b*.

In other words, the refrigerant introduced through the inflow hole 111 of the base layer 110 may move to the inlet holes h1 of the first to eighth flow paths C1 to C8 after passing through the first inflow passage 131*a* and flow into the space s surrounded by the side wall f1 and the bottom surface f2 through the inlet holes h1, and the refrigerant flowing into the space s may be discharged through the outlet holes h2 after passing between the plurality of pins p and discharged through the pair of discharge holes 112 after passing through the pair of first discharge passages 131*b* connected to the outlet holes h2.

FIG. 6 is an exploded perspective view illustrating a heat sink according to a second modified example in which an intermediate layer is different from that of the embodiment of FIG. 3.

As illustrated in FIG. 6, in a heat sink 100B according to a second modified example, the first inflow passage 131*a* formed in the first intermediate layer 131 may be formed to extend to face the inlet holes h1 of the second flow path C2, the third flow path C3, the fourth flow path C4, the sixth flow path C6, the seventh flow path C7, and the eighth flow path C8. As described above, the first inflow passage 131*a* and the first discharge passage 131*b* of the intermediate layer 130, and the inflow hole 111 and the discharge hole 112 of the base layer 110 may be provided to have the numbers, shapes, and the like that may be changed depending on the required heat-dissipation characteristics.

Hereinafter, a ceramic substrate with a heat sink according to another embodiment of the present disclosure will be described with reference to FIGS. 7 to 9.

FIG. 7 is a perspective view illustrating a ceramic substrate with a heat sink according to another embodiment of the present disclosure, FIG. 8 is an exploded perspective view illustrating the ceramic substrate with the heat sink according to another embodiment of the present disclosure, and FIG. 9 is a plan view illustrating the ceramic substrate with the heat sink according to another embodiment of the present disclosure.

As illustrated in FIG. 7, a heat sink 100' may include a base layer 110', a flow path layer 120', and at least one intermediate layer 130', and the at least one intermediate layer 130' may further include a second intermediate layer 132'.

As illustrated in FIG. 8, each of the plurality of flow paths C1', C2', C3', and C4' of the flow path layer 120' may be provided as a through hole 121'. In this case, the through hole 121' may be formed in a zigzag shape with a repeated curved shape, and the zigzag shape extends a path along which the refrigerant moves to make it easy to expand the heat dissipation area.

The second intermediate layer 132' may be disposed between the first intermediate layer 131' and the flow path layer 120' and may include a second inflow passage 132*a'* formed to correspond to one end of at least one of the plurality of flow paths C1', C2', C3', and C4', and a second discharge passage 132*b'* formed to correspond to the other end of at least one of the plurality of flow paths C1', C2', C3', and C4'. Specifically, the second inflow passage 132*a'* of the second intermediate layer 132' may be formed to correspond to one end of the through hole 121' of each of the plurality of flow paths C1', C2', C3', and C4', and the second discharge passage 132*b'* of the second intermediate layer 132' may be formed to correspond to the other end of the through hole 121' of each of the plurality of flow paths C1', C2', C3', and C4'. Here, the second inflow passage 132*a'* may face the first inflow passage 131*a'*, and the second discharge passage 132*b'* may face the first discharge passage 131*b'*.

As illustrated in FIG. 9, since the second intermediate layer 132' is provided in the form of a flat plate, when the second intermediate layer 132' is bonded to a lower portion of the flow path layer 120', a flow path groove h3' may be formed of an inner surface of the through hole 121' and an upper surface of the second intermediate layer 132'. In other words, when the flow path layer 120' and the second intermediate layer 132' are bonded, an open lower portion of the through hole 121' may be closed by the upper surface of the second intermediate layer 132' to form the flow path groove h3' that is a space in which the refrigerant may move.

Describing the refrigerant circulation path in the heat sink 100' with reference to FIGS. 8 and 9, the refrigerant introduced through an inflow hole 111' of the base layer 110' may move to the second inflow passage 132*a'* of the second intermediate layer 132' after passing through the first inflow passage 131*a'* of the first intermediate layer 131', flow into the flow path groove h3', which is the space surrounded by the inner surface of the through hole 121' and the upper surface of the second intermediate layer 132' through the second inflow passage 132*a'*, and thereafter, the refrigerant may be discharged through the second discharge passage 132*b'* of the second intermediate layer 132' after moving along the flow path groove h3' with a zigzag shape. Then, the refrigerant may be discharged through the discharge hole 112' of the base layer 110' after passing through the first discharge passage 131*b'* connected to the second discharge passage 132*b'*.

The heat sink 100' according to another embodiment of the present disclosure has a larger number of layers forming the heat sink 100' than those of the embodiment illustrated in FIGS. 2 to 4. When the number of layers forming the heat sink 100' further increases, a flow rate of the refrigerant may be increased. Therefore, the number of layers of the heat sink 100' may be variously designed to fit a flow rate of refrigerant required according to preliminary simulation results.

In the heat sink 100' according to another embodiment of the present disclosure, the flow path layer 120' positioned at an uppermost portion and the base layer 110' positioned at a lowermost portion may be any one material of Cu, Al, stainless steel (STS), and a Cu alloy. In addition, materials of the first intermediate layer 131' and the second intermediate layer 132' disposed between the flow path layer 120' and the base layer 110' may be any one of the CuMo and Mo materials.

As an example, when the base layer 110' and the flow path layer 120' are formed of the metal layer made of the Cu material and the first intermediate layer 131' and the second intermediate layer 132' are formed of the metal layer made of the CuMo material, it is possible to prevent bending at the high temperature due to the metal layer made of the CuMo material with the relatively lower coefficient of thermal expansion and satisfy the high heat-dissipation conditions required by the power module due to the metal layer made of the Cu material with the high thermal conductivity.

FIG. 10 is an exploded perspective view illustrating a heat sink according to a modified example in which a flow path layer is different from that of the embodiment of FIG. 8, and FIG. 11 is a plan view illustrating the heat sink of FIG. 10.

A heat sink 100" according to a modified example of FIGS. 10 and 11 may include a plurality of flow paths C1", C2", C3", and C4" disposed on an upper surface of the flow path layer 120" in a matrix, and each of the plurality of flow paths C1", C2", C3", and C4" may be provided as a flow path groove h3" with the zigzag shape with a repeated curved shape. The flow path groove h3" may include an inlet hole h1" formed at one end thereof and an outlet hole h2" formed at the other end thereof. In other words, the refrigerant flowing into the flow path groove h3" through the inlet hole h1" may be discharged through the outlet hole h2" after moving along the flow path groove h3". Specifically, the refrigerant introduced through an inflow hole 111" of the base layer 110" may move to the inlet hole h1" of at least one of the plurality of flow paths C1", C2", C3", and C4" after sequentially passing through a first inflow passage 131a" and a second inflow passage 132a", and the refrigerant discharged through the outlet hole h2" after moving along the flow path groove h3" connected to the inlet hole h1" may be discharged through a discharge hole 112" of the base layer 110" after sequentially passing through a second discharge passage 132b" and a first discharge passage 131b".

Meanwhile, positions of the inlet holes h1" and the outlet holes h2", positions of the inflow hole 111" and the discharge hole 112", positions of the first inflow passage 131a" and the first discharge passage 131b", and positions of the second inflow passage 132a" and the second discharge passage 132b" may be reversed. In other words, when the refrigerant circulation driving unit 20 is connected, the refrigerant circulation driving unit 20 may be connected so that the refrigerant is introduced through the discharge hole 112" and the refrigerant is discharged through the inflow hole 111". Specifically, the refrigerant introduced through the discharge hole 112" of the base layer 110" may move to the outlet hole h2" of at least one of the plurality of flow paths C1", C2", C3", and C4" after sequentially passing through the first discharge passage 131b" and the second discharge passage 132b", and the refrigerant discharged through the inlet hole h1" after moving along the flow path groove h3" connected to the outlet hole h2" may be discharged through the inflow hole 111" of the base layer 110" after sequentially passing through the second inflow passage 132a" and the first inflow passage 131a".

FIG. 12 is a flowchart illustrating a method of manufacturing the ceramic substrate with the heat sink according to one embodiment of the present disclosure.

As illustrated in FIG. 12, a method of manufacturing the ceramic substrate with the heat sink according to one embodiment of the present disclosure may include preparing the ceramic substrate 10 including the metal layer 12 on at least one surface of the ceramic base 11 (S10), preparing the heat sink 100 with the multi-layer structure through which refrigerant enters and exits (S20), and bonding one surface of the ceramic substrate 10 to one surface of the heat sink 100 (S30).

In the preparing of the ceramic substrate 10 (S10), the ceramic substrate 10 may be an active metal brazing (AMB) substrate including the metal layer 12 on the at least one surface of the ceramic base 11.

In the preparing of the heat sink 100 (S20), the thickness of the heat sink 100 may be in a range of 1.0 to 15.0 mm. Preferably, since the thickness of the heat sink 100 is 2.0 mm or more, it is advantageous for heat dissipation and it is possible to minimize the occurrence of bending.

In addition, in the preparing of the heat sink 100 (S20), the heat sink 100 in which at least two adjacent layers of the multi-layer structure are made of different metal materials may be prepared. In other words, the heat sink 100 may have the multi-layer structure including the base layer 110, the flow path layer 120, and the at least one intermediate layer 130, and at least two adjacent layers of the multi-layer structure may be made of different metal materials. Specifically, the base layer 110 and the flow path layer 120 may be made of the same metal material, and the at least one intermediate layer 130 may be made of a different metal material from the base layer 110 and the flow path layer 120. For example, when the base layer 110 and the flow path layer 120, which are made of the Cu material, that have the relatively higher coefficient of thermal expansion but have a high thermal conductivity are bonded to the upper and lower portions of the intermediate layer 130 made of the CuMo material with the relatively lower coefficient of thermal expansion, by decreasing the coefficient of thermal expansion, it is possible to prevent the bending phenomenon at the high temperature.

FIG. 13 is a flowchart illustrating preparing the heat sink in the method of manufacturing the ceramic substrate with the heat sink according to one embodiment of the present disclosure.

As illustrated in FIG. 13, the preparing of the heat sink 100 (S20) includes preparing the base layer 110 in which the inflow hole 111 and the discharge hole 112 are formed (S21), preparing the flow path layer 120 in which the plurality of flow paths C1 to C8 are disposed in a matrix (S22), preparing the at least one intermediate layer 130 formed with the inflow passage connecting one end of at least one of the plurality of flow paths C1 to C8 to the inflow hole 111 and formed with the discharge passage connecting the other end of at least one of the plurality of flow paths C1 to C8 to the discharge hole 112 (S23), forming the bonding layer on at least one surface of the at least one intermediate layer 130 (S24), and stacking the at least one intermediate layer 130 and the flow path layer 120 (S25).

Here, the preparing of the base layer 110 (S21), the preparing of the flow path layer 120 (S22), and the preparing of the at least one intermediate layer 130 (S23) may be performed sequentially or performed after changing the order and performed substantially at the same time.

In the preparing of the base layer 110 (S21), the inflow hole 111 and the discharge hole 112 are formed to be connected to the external refrigerant circulation driving unit 20 and may be formed to pass therethrough by etching processing or the like.

In the preparing of the flow path layer 120 (S22), a groove, a hole, or the like through which the refrigerant may move may be variously formed in the plurality of flow paths C1 to C8 by etching a portion of the flow path layer 120.

The preparing of the at least one intermediate layer 130 (S23) may include preparing the first intermediate layer 131 including the first inflow passage 131*a* extending long toward one end of at least one of the plurality of flow paths C1 to C8, and the first discharge passage 131*b* extending long toward to the other end of at least one of the plurality of flow paths C1 to C8. In this case, the number of layers forming the intermediate layer 130, and the shapes and numbers of inflow passages and discharge passages may be variously designed by being changed to fit the flow rate of the refrigerant required according to the preliminary simulation results.

In the forming of the bonding layer (S24), the bonding layer made of a material containing at least one of Ag and AgCu may be formed on at least one surface of the at least one intermediate layer 130 by any one method of plating, paste application, and foil attachment. In this case, the bonding layer may be formed on the upper and lower surfaces of the first intermediate layer 131. In addition, in another embodiment of the present disclosure, when the bonding layer is formed on the upper and lower surfaces of the first intermediate layer 131', the bonding layer may be formed on the upper surface facing the flow path layer 120' of the second intermediate layer 132' disposed above the first intermediate layer 131'.

In the stacking of the base layer 110, the at least one intermediate layer 130, and the flow path layer 120, the base layer 110, the at least one intermediate layer 130, and the flow path layer 120 may be sequentially stacked. The bonding layer formed on the at least one surface of the intermediate layer 130 may be disposed between the layers. In other words, the bonding layer may be disposed between the base layer 110 and the first intermediate layer 131 and between the first intermediate layer 131 and the flow path layer 120. In addition, in another embodiment of the present disclosure, the base layer 110', the first intermediate layer 131', the second intermediate layer 132', and the flow path layer 120' may be sequentially stacked. In this case, the bonding layer may be disposed between the base layer 110' and the first intermediate layer 131', between the first intermediate layer 131' and the second intermediate layer 132', and between the second intermediate layer 132' and the flow path layer 120'.

The preparing of the heat sink 100 (S20) may further include brazing the base layer 110, the at least one intermediate layer 130, and the flow path layer 120 by melting the bonding layer (S26) after the stacking of the base layer 110, the at least one intermediate layer 130, and the flow path layer 120 (S25).

In the brazing (S26), the base layer 110, the at least one intermediate layer 130, and the flow path layer 120 may be brazed by melting the bonding layer interposed between the layers at 800 to 950° C. in a stacked state, and at this time, a weight or pressing may be applied to the top in order to increase the bonding strength.

FIG. 14 is a flowchart illustrating bonding one surface of the ceramic substrate to one surface of the heat sink in the method of manufacturing the ceramic substrate with the heat sink according to one embodiment of the present disclosure.

As illustrated in FIG. 14, the bonding of the one surface of the ceramic substrate 10 to the one surface of the heat sink 100 (S30) includes forming a bonding base (not illustrated) on one surface of the ceramic substrate 10 or one surface of the flow path layer 120 (S31), arranging the one surface of the ceramic substrate 10 and the one surface of the flow path layer 120 to face each other (S32), and brazing the base layer 110, the at least one intermediate layer 130, the flow path layer 120, and the ceramic substrate 10 at the same time by melting the bonding base and the bonding layer (S33).

In the forming of the bonding base (S31), the bonding base made of a material containing at least one of Ag and AgCu may be formed on the one surface of the ceramic substrate 10 or the one surface of the flow path layer 120 by any one method of plating, paste application, and foil attachment.

In the arranging of the one surface of the ceramic substrate 10 and the one surface of the flow path layer 120 to face each other (S32), the ceramic substrate 10 and the flow path layer 120 may be disposed to be stacked with the bonding base interposed therebetween. Here, the base layer 110, the at least one intermediate layer 130, and the flow path layer 120 of the heat sink 100 may be in a state of being stacked so that the bonding layer is interposed between the layers. In other words, the base layer 110, the at least one intermediate layer 130, and the flow path layer 120 of the heat sink 100 may be in a state before being brazed.

In the brazing of the base layer 110, the at least one intermediate layer 130, the flow path layer 120, and the ceramic substrate 10 at the same time (S33), the base layer 110, the first intermediate layer 131, the flow path layer 120, and the ceramic substrate 10 may be brazed at the same time by melting the bonding layers disposed between the base layer 110 and the first intermediate layer 131 and between the first intermediate layer 131 and the flow path layer 120 and the bonding base disposed between the flow path layer 120 and the ceramic substrate 10. At this time, the brazing temperature for melting the bonding layer and the bonding base may be in a range of 800 to 950° C., and a weight or pressing may be applied to the top in order to increase the bonding strength.

As described above, when the base layer 110, the at least one intermediate layer 130, the flow path layer 120, and the ceramic substrate 10 are brazed at the same time, it is possible to simplify the process and contribute to reducing the process cost.

In addition, in another embodiment of the present disclosure, the base layer 110', the first intermediate layer 131', the second intermediate layer 132', the flow path layer 120', and the ceramic substrate 10 may be brazed at the same time by melting the bonding layers disposed between the base layer 110' and the first intermediate layer 131', between the first intermediate layer 131' and the second intermediate layer 132', and between the second intermediate layer 132' and the flow path layer 120' and the bonding base disposed between the flow path layer 120' and the ceramic substrate 10.

Meanwhile, although one embodiment and another embodiment of the present disclosure have been described separately, these can be applied interchangeably.

The best embodiments of the present disclosure have been disclosed in the drawings and the specification. Here, although specific terms are used, they are used only for the purpose of describing the present disclosure and are not used to limit the meaning or scope of the present disclosure described in the claims. Therefore, those skilled in the art will understand that various modifications and equivalent embodiments are possible from the present disclosure. Therefore, the true technical scope of the present disclosure should be determined by the technical spirit of the appended claims.

The invention claimed is:

1. A heat exchange system comprising:
   a ceramic substrate including a metal layer on at least one surface of a ceramic base; and
   a heat sink bonded to the one surface of the ceramic substrate and having a multi-layer structure through which refrigerant enters and exits, wherein the heat sink includes:

a base layer in which an inflow hole and a discharge hole are formed;

a flow path layer which is disposed above the base layer and on which a plurality of flow paths are disposed in a matrix; and at least one intermediate layer disposed between the base layer and the flow path layer, formed with an inflow passage connecting one end of at least one of the plurality of flow paths to the inflow hole, and formed with a discharge passage connecting the other end of at least one of the plurality of flow paths to the discharge hole, wherein a coefficient of thermal expansion of the at least one intermediate layer is lower than coefficients of thermal expansion of the base layer and the flow path layer, and wherein the overall thickness of the at least one intermediate layer is greater than a thickness of each of the base layer and the flow path layer.

2. The heat exchange system of claim 1, wherein the heat sink has at least two adjacent layers made of different metal materials of the multi-layer structure.

3. The heat exchange system of claim 1, wherein the base layer and the flow path layer are made of the same metal material, and the at least one intermediate layer is made of a different metal material from the base layer and the flow path layer.

4. The heat exchange system of claim 1, wherein a material of the at least one intermediate layer is any one of CuMo and Mo, and materials of the base layer and the flow path layer are any one of Cu, Al, stainless steel (STS), and a Cu alloy.

5. The heat exchange system of claim 1, wherein refrigerant introduced through the inflow hole is discharged through the discharge hole via the at least one intermediate layer and the flow path layer.

6. The heat exchange system of claim 5, wherein the inflow hole and the discharge hole are formed to be connected to an external refrigerant circulation driving unit, and the refrigerant is continuously circulated by the refrigerant circulation driving unit.

7. The ceramic substrate with the heat sink of claim 1, wherein each of the plurality of flow paths includes:

a plurality of pins provided in a space surrounded by a side wall and a bottom surface and disposed at intervals; and an inlet hole and an outlet hole formed to pass through one end and the other end of the bottom surface with the plurality of pins interposed therebetween, and refrigerant flowing into the space through the inlet hole is discharged through the outlet hole after passing between the plurality of pins.

8. The heat exchange system of claim 1, wherein the at least one intermediate layer includes a first intermediate layer including a first inflow passage extending long toward one end of at least one of the plurality of flow paths, and a first discharge passage extending long toward the other end of at least one of the plurality of flow paths, and the first inflow passage faces the inflow hole, and the first discharge passage faces the discharge hole.

9. The heat exchange system of claim 8, wherein the at least one intermediate layer further includes a second intermediate layer including a second inflow passage disposed between the first intermediate layer and the flow path layer and formed to correspond to one end of at least one of the plurality of flow paths, and a second discharge passage formed to correspond to the other end of at least one of the plurality of flow paths, and the second inflow passage faces the first inflow passage, and the second discharge passage faces the first discharge passage.

10. The heat exchange system of claim 9, wherein each of the plurality of flow paths is provided as a through hole in a zigzag shape with a repeated curved shape, a flow path groove is formed of an inner surface of the through hole and an upper surface of the second intermediate layer, and refrigerant flowing into the flow path groove through the second inflow passage is discharged through the second discharge passage after moving along the flow path groove.

11. The heat exchange system of claim 1, wherein each of the plurality of flow paths is provided as a flow path groove in a zigzag shape with a repeated curved shape, the flow path groove includes an inlet hole formed at one end thereof and an outlet hole formed at the other end thereof, and refrigerant flowing into the flow path groove through the inlet hole is discharged through the outlet hole after moving along the flow path groove.

12. The ceramic substrate with the heat sink of claim 1, wherein the heat sink further includes a bonding layer bonding the base layer, the at least one intermediate layer, and the flow path layer, and the bonding layer is made of a material including at least one of Ag and AgCu.

* * * * *